(12) United States Patent
Partridge

(10) Patent No.: US 7,375,418 B2
(45) Date of Patent: May 20, 2008

(54) INTERPOSER STACKING SYSTEM AND METHOD

(75) Inventor: Julian Partridge, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 216 days.

(21) Appl. No.: 11/452,532

(22) Filed: Jun. 14, 2006

(65) Prior Publication Data

US 2007/0290313 A1 Dec. 20, 2007

(51) Int. Cl.
*H01L 23/02* (2006.01)
(52) U.S. Cl. ............. 257/685; 257/666; 257/692; 257/696; 257/E25.021; 257/E25.027; 257/E25.006; 257/E25.013; 257/E25.018; 257/E23.085
(58) Field of Classification Search ........ 257/666–677, 257/685, 686, 692, 696, 723, 777, E23.004, 257/E23.031–E23.059, E25.006, E25.013, 257/E25.018, E25.021, E25.027, E23.085, 257/E21.614; 437/109, FOR. 368, FOR. 426
See application file for complete search history.

(56) References Cited

U.S. PATENT DOCUMENTS 5,266,834 A * 11/1993 Nishi et al. ............. 257/706
5,343,075 A * 8/1994 Nishino ............. 257/686
5,514,907 A * 5/1996 Moshayedi ............. 257/723
6,462,408 B1 * 10/2002 Wehrly, Jr. ............. 257/686
6,538,895 B2 * 3/2003 Worz et al. ............. 361/735
6,542,393 B1 * 4/2003 Chu et al. ............. 365/51
6,572,387 B2 * 6/2003 Burns et al. ............. 439/69
6,608,763 B1 * 8/2003 Burns et al. ............. 361/790
2002/0190367 A1 * 12/2002 Mantz et al. ............. 257/686

* cited by examiner

Primary Examiner—Jasmine J Clark
(74) Attorney, Agent, or Firm—Fish & Richardson P.C.

(57) ABSTRACT

The present invention provides a system and method for selectively stacking and interconnecting leaded packaged integrated circuit devices with connections between the feet of leads of an upper IC element and the upper shoulder of leads of a lower IC element while traces that implement stacking-related intra-stack connections between the constituent ICs are implemented in interposers or carrier structures oriented along the leaded sides of the stack and which extend beyond the perimeter of the feet of the leads of the constituent ICs or beyond the connective pads of the interposer. This leaves open to air flow, most of the transit section of the lower lead for cooling, but provides a less complex board structure for implementation of intra-stack connections.

25 Claims, 9 Drawing Sheets

INTERPOSER STACKING SYSTEM AND METHOD

TECHNICAL FIELD

The present invention relates to aggregating integrated circuits and, in particular, to stacking integrated circuits.

BACKGROUND

A variety of techniques are used to stack integrated circuits. Some require that the circuits be encapsulated in special packages, while others use circuits in conventional packages. Both leaded and BGA type packaged integrated circuits (ICs) have been stacked. Although BGA packaging becoming widely adopted, leaded packages are still employed in large volumes in low cost applications such as, for example, flash memory which is typically packaged in thin small outline packages otherwise known as TSOPs.

When leaded packages such as TSOPs are stacked, a variety of techniques have been employed. In some cases, the leads alone of packaged circuits have been used to create the stack and interconnect its constituent elements. In other techniques, structural elements such as printed circuit boards (PCBs) are used to create the stack and interconnect the constituent elements.

Circuit boards and rail-like structures in vertical orientations have been used for years to provide interconnection between stack elements. For example, in U.S. Pat. No. 5,514,907 to Moshayedi, a technique is described for creating a multi-chip module from surface-mount packaged memory chips. The devices are interconnected on their lead emergent edges through printed circuit boards oriented vertically to a carrier or motherboard that is contacted by connective sites along the bottom of the edge-placed PCBs. The PCBs have internal connective rail-like structures or vias that interconnect selected leads of the upper and lower packaged memory chips. Japanese Patent Laid-open Publication No. Hei 6-77644 discloses vertical PCBs used as side boards to interconnect packaged circuit members of the stack. In U.S. Pat. No. 5,266,834 to Nishi et al., one depicted embodiment illustrates a stack created by selective orientation of the leads of particularly configured stack elements, while in U.S. Pat. No. 5,343,075 to Nishino, a stack of semiconductor devices is created with contact plates having connective lines on inner surfaces to connect the elements of the stack. Another technique for stacking leaded packaged ICs with carrier structures or interposers oriented along lead bearing sides of packaged devices such as TSOPs is disclosed by the present assignee, Staktek Group L.P., in U.S. Pat. No. 6,608,763 to Burns et al.

Many of the previously cited and known techniques for using PCBs and similar interposer structures for stacking leaded packaged devices have evolved to meet the increased connective complexity presented by, for example, stacking memory components that have two chip enables per packaged device. In some cases, this evolution has included use of interposer designs that employ four layer designs to implement the more complex connection strategies required by more complex devices. This has led to complexities in via and connection strategies, however.

Higher layer count PCBs and similar interposers are more expensive and difficult to produce than simpler designs with fewer layers. Such connective elements also typically exhibit wider variations across the population. What is needed, therefore, is a system and method for stacking leaded packaged devices that implements more complex connection strategies with reduced layer counts in technologies that are easily understood and implemented with known techniques and materials but still meet profile requirements at the surface of the circuit board.

SUMMARY OF THE INVENTION

The present invention provides a system and method for selectively stacking and interconnecting leaded packaged integrated circuit devices with connections between the feet of leads of an upper IC element and the upper shoulder of leads of a lower IC element while traces that implement stacking-related intra-stack connections between the constituent ICs are implemented in interposers or carrier structures oriented along the leaded sides of the stack and which extend beyond the perimeter of the feet of the leads of the constituent ICs or beyond the connective pads of the interposer. This leaves open to air flow, most of the transit section of the lower lead for cooling, but provides a less complex board structure for implementation of intra-stack connections.

DETAILED DESCRIPTION

Figure 1A:
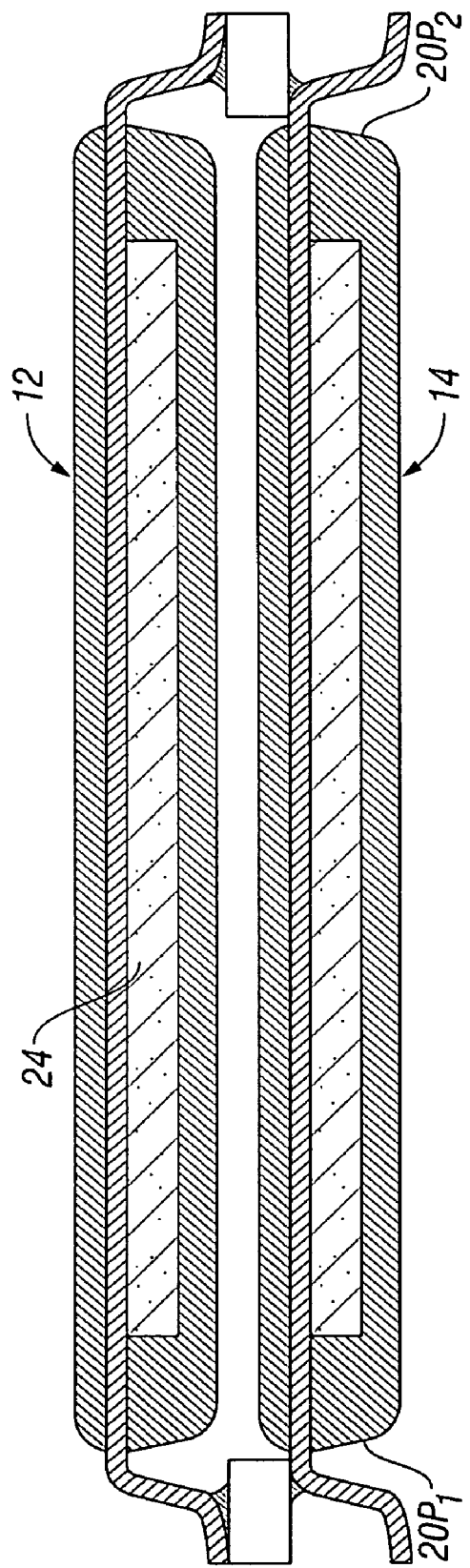
FIGS. 1A and 1B depicts cross-sections of a prior art circuit module that employs interposers (e.g., "carrier structures", "side boards") that implement intra-stack connections.
Figure 1B:
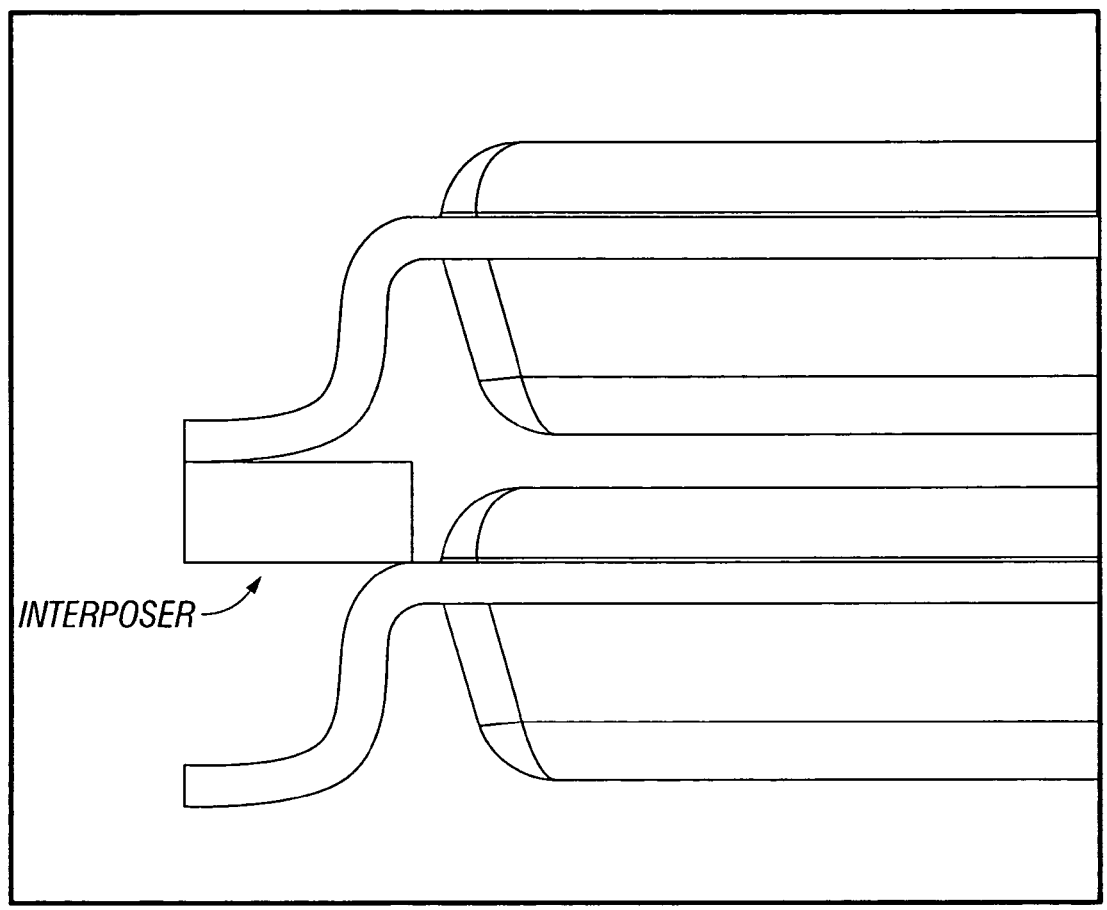

FIG. 1A depicts a cross-section of a prior art circuit module that employs interposers (e.g., "carrier structures", "side boards") that implement intra-stack connections. As shown, interposers reside along the edge of the module and interconnects the feet of leads that emerge from first and second peripheral sides 20P1 and 20P2 of the upper IC 12 to the shoulder of leads of the lower IC 14. The ICs have within their respective packages integrated circuit die 24. FIG. 1B is an enlarged view of a portion of the prior art module of FIG. 1A. The depicted ICs are typically thin small outline packages known as TSOPs which are a common packaging option for flash memory circuitry. In structures such as that depicted in FIGS. 1A and 1B, the interposers typically extend to about the feet of the constituent ICs and any needed traces that connect non-adjacent pads of the interposers transit through buried layers of the interposer.

Figure 2A:
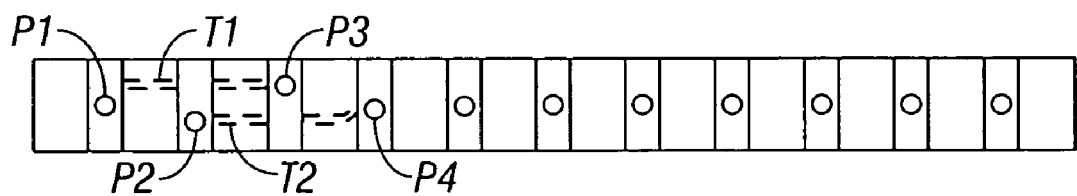
FIGS. 2A and 2B various views of an interposer employed in the prior art circuit module depicted in FIGS. 1A and 1B.
Figure 2B:
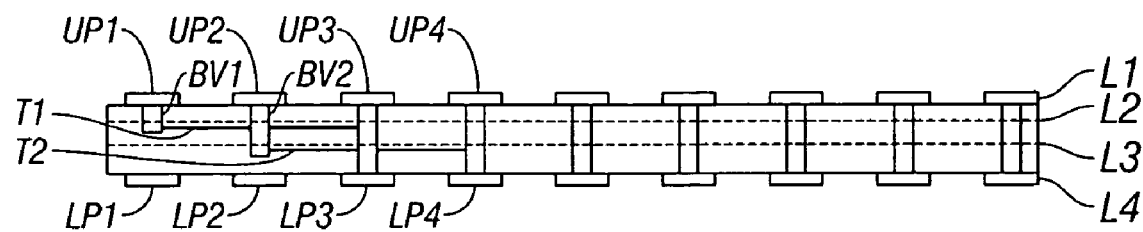

FIGS. 2A and 2B various views of an interposer employed in the prior art circuit module depicted in FIG. 1. FIG. 2A is a plan view of a prior art interposer from above and depicts with dotted lines two traces T1 and T2 routed through buried layers in the interposer in ways that avoid interference with vias P2 and P3, respectively. FIG. 2B depicts a cross-sectional view from the side of an interposer employed in the prior art module shown in FIG. 1.

As those of skill understand, typically only one of the constituent IC devices of a stack is enabled at a time. However, some TSOPs have two chip enable leads that must be signaled for device enablement. Thus, when a stack is devised from such devices, the two CE signals that are available to the stack must be applied to two leads in each of the two constituent devices or, to four leads total. This adds complexity to the interposer design and fabrication. Designers of stacks that employ interposers disposed between the feet of the upper IC and the shoulders of the lower IC typically try to keep the profile of the stack approximately the same as the profile of the constituent IC devices. This objective and the need for differential enablement strategies in connecting the upper and lower ICs typically causes designers to resort to buried layers in the interposer to implement trace connections between leads, particularly when the leads to be connected are not adjacent on the IC. This can require moving particular pins to avoid interference between a pin that is between two pins that are to be connected by a trace. FIGS. 2A and 2B illustrate a particular example of the presented complexity problem presented by stacking TSOP devices with feet-to-shoulder interposers, each disposed along a leaded side of the constituent devices where profiles for the resulting stack are commensurate with the profiles of the constituent ICs.

Consequently, as shown in FIGS. 2A and 2B, blind vias such as those identified as BV1 and BV2 are connected to traces T1 and T2 and then to lower pads LP3 and LP4. Thus, signals at LP3 are conveyed to upper pads UP3 and UP1 while signals at LP4 are conveyed to UP4 and UP2. Traces T1 and T2 are, however, implemented at layers 2 and 3 respectively, of the depicted four layer board (showing layers L1, L2, L3, and L4). Layers 2 and 3 are, however, buried in the interposer. As those of skill will recognize, PCB materials that may be used as interposers in such applications can be devised with multiple buried metal layers to implement trace connections between vias but such structures are likely to exhibit thicker profiles and are complex to manufacture efficiently and may have wider variations from instance to instance.

As discussed, designers of this category of stack have typically tried to stay within profile limits thus resulting in implementation of carrier structures or interposers that exhibit the more complex designs alluded to and an example of which was just described. However, profile requirements are typically intended to preserve mounting board area. Thus, if a profile constraint is intended to preserve mounting board area but is not devised to limit cantilever designs that may exceed the profile but only above the surface of the mounting board, a wider interposer above mounting circuit board level may, in some cases, be employed to preserve board mounting space and still implement connections in stacks which retain the foot to shoulder interposer constructions that keeps a substantial portion of the leads open.

Figure 3:
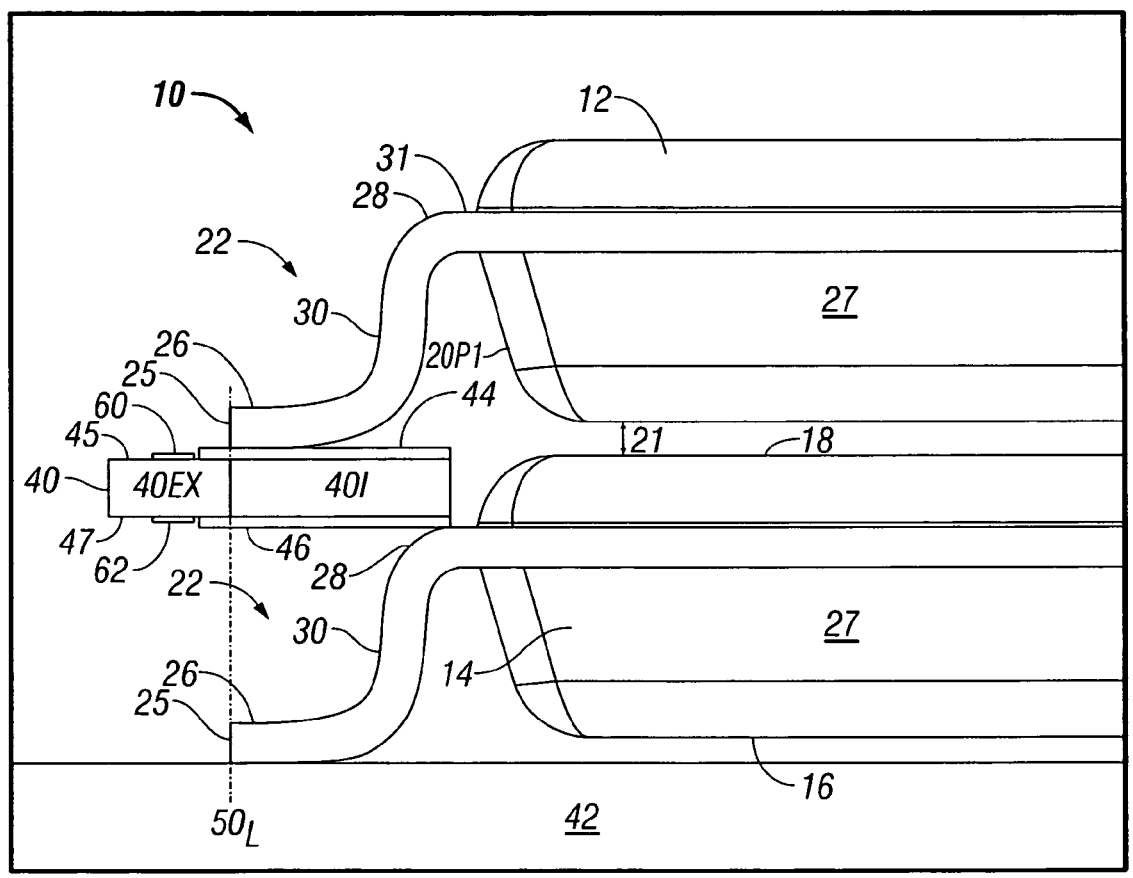
FIG. 3 depicts a cross-section of a portion of circuit module that employs interposers that exhibit external traces on the respective upper and lower surfaces for implementing connections between two non-adjacent leads in a preferred embodiment of the present invention.

FIG. 3 depicts a cross-section of a portion of circuit module 10 that employs interposer 40 that exhibits external traces 60 and 62 on the respective upper and lower surfaces 45 and 47 of interposer 40 for implementing, for example, connections between two non-adjacent leads. As shown, module 10 is created with upper IC 12 and lower IC 14. Each of ICs 12 and 14 are, in the depicted preferred embodiment, plastic encapsulated memory circuits disposed in thin small outline packages known as TSOPs. Other package types may be used with the present invention as well as packaged circuits other than memories, but, as described here as preferred examples, the invention is advantageously implemented with memories in TSOP packaging. Flash memory circuits implemented in TSOP packaging are one type of preferred constituent ICs 12 and 14. As shown in FIG. 3 as to lower IC 14, but present in both IC 12 and 14 of module 10, each IC has a lower surface 16, upper surface 18 and periphery. In this FIG. 3, there is depicted an air gap 21 between IC 12 and IC 14 although a heat transference material or adhesive (thermally conductive being preferred) may reside between the ICs as shown in later FIG. 5.

As depicted in FIG. 3, emergent from package peripheral wall or edge 20P, plural leads one of which is illustrated as lead 22, provide a connective pathway for the electronics of the circuitry chip embedded within plastic body 27 of exemplar IC 12. Those of skill will note that in a typical embodiment the leads are emergent from each of two peripheral sides 20P1 and 20P2 of the respective IC. There are, however, some packages that may have leads emergent from greater or fewer numbers of peripheral sides.

Lead 22 of upper IC 12 is shown as having foot 26 and shoulder 28 and transit section 30 but similar features may be identified in lead 22 of lower IC 14. Shoulder 28 can extend from and include the planar part of lead 22 emergent from peripheral wall 20P (i.e., the "head" of the shoulder identified by reference 31) to the end of the curvature into transit section 30. As leads 22 emerge from the package periphery, a supportive shelf or plane is created or defined (respectively) by the heads of the plurality of leads on a side. These features of lead 22 are present in conventional TSOP packaged memory circuits such as flash memory available from most major suppliers of packaged memories. Foot 26 is provided to allow the mounting of the TSOP IC on the surface of a printed circuit or other carrier and signal transit board and has therefore a terminus 25. The termini 25 of the feet of the plural leads 22 define a line 50L that coincides with the profile for the ICs as well as stacked module 10 at the level of the circuit board. In FIG. 3. circuit module 10 is shown mounted on circuit board 42.

Shoulder 28 arises from providing foot 26 for surface mount connection of the IC, while transit section 30 of lead 22 connects shoulder 28 with foot 26. In practice, lead 22 and, in particular, transit section 30 are surfaces from which heat from the internal chip(s) of the TSOP is dissipated by local air convection. Transit section 30 is often a substantially straight path but may exhibit curvature.

Interposer or carrier structure 40 is shown in FIG. 3 as being interposed between shoulder 28 of lead 22 of lower IC 14 and foot 26 of lead 22 of upper IC 12. In a preferred embodiment, interposer 40 has upper and lower substantially planar surfaces 45 and 47, respectively. Upper surface 45 bears a row of plural upper connective elements 44 and lower surface 47 bears a row of plural lower connective elements 46. These elements 44 and 46 are shown as resting upon upper and lower surfaces 45 and 47 of interposer 40, respectively, but as those of skill will recognize, these elements or pads may be embedded into those surfaces and in typical applications will be implemented as pads.

In module 10, upper connective elements 44 are disposed beneath the feet of the leads of IC 12 and the lower surface 47 is placed along the plane of heads 31 of selected leads of lower IC 14 as shown in FIG. 3. Carrier structure or interposer 40 is, in a preferred embodiment, printed circuit board material or other carrier material disposed between corresponding leads of constituent elements of module 10. Other structures that provide connective elements in an insulative bed or carrier may be employed as interposer or carrier structure 40. So called flex circuit, known to those of skill in the art is an example of an alternative material for interposer or carrier structure 40. Interposer or carrier structure 40 retains upper IC 12 in orientation with lower IC 14. Interposer 40 provides a horizontal structure to support electrical connection between appropriate leads of upper and lower ICs 12 and 14. Such a method and structure exploits the existing lead assemblage of the constituent ICs. Although the leads are provided by the TSOP manufacturer to enable surface mounting (SMT) of the TSOP, the horizontal interposer or carrier structure 40 provides advantages to the lead assemblage, namely, a low capacitance carrier for a conductive pathway that allows inter-element spacing, efficient cooling, and simple stack construction and interconnectivity with structural integrity and appropriate height.

In a preferred embodiment, two interposers 40 are typically employed in a module 10 comprised from two TSOP memory devices. One interposer 40 is disposed along one leaded periphery of module 10, while another interposer 40 is disposed in conjunction with an opposite leaded periphery of the module. The same principles may be applied to stacks where the constituent ICs have more or fewer than two leaded sides.

An imaginary line 50L may be defined by the terminal ends 25 of the feet 26 of leads 22 of upper IC 12. As those of skill know, a TSOP IC has a plurality of leads, and the plural ends of the feet of those plural leads are aligned in a row. That row line of the ends or termini 25 constitute line 50L.

Figure 4:
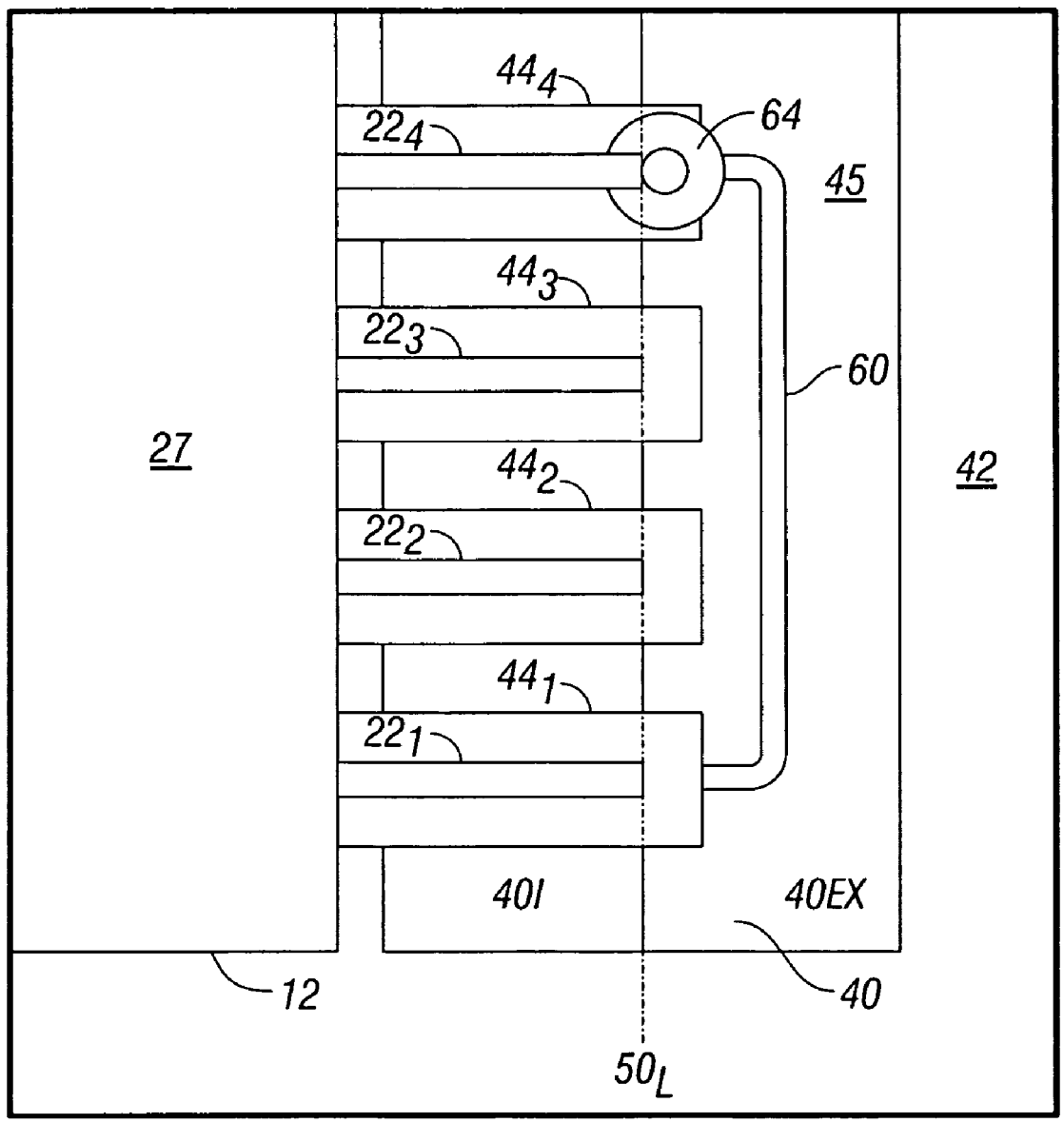
FIG. 4 depicts a plan view from above of a portion of an interposer showing leads disposed on upper connective pads in accordance with a preferred embodiment of the present invention.

FIG. 4 depicts a plan view from above of a portion of an interposer 40 and leads $22_1$-$22_4$ (e.g., feet 26) as disposed on upper connective elements $44_1$-$44_4$. Connective trace 60 is shown extending from upper connective elements $44_1$ to upper connective element $44_4$. Illustrative via 64 is shown associated with upper connective element $44_4$.

Interposer 40 is allocated into two sections, an inner section 40I toward the body 27 of IC 12 and an outer or external section 40EX. The line between interposer sections 40I and 40EX is line 50L.

Figure 5:
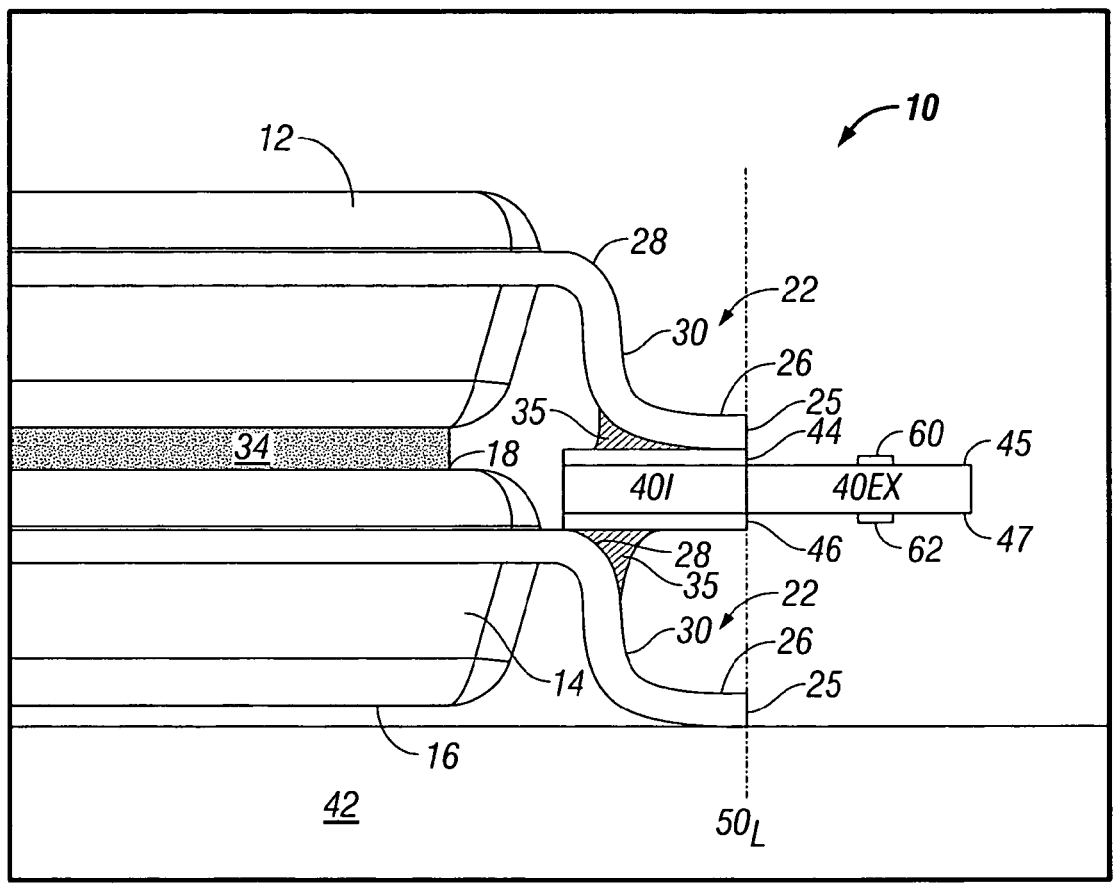
FIG. 5 illustrates a cross-sectional view of a portion of a circuit module 10 according to a preferred embodiment of the present invention.

FIG. 5 illustrates a cross-sectional view of a portion of a circuit module 10 according to a preferred embodiment of the present invention. Interposer or carrier structure 40 is soldered into place as shown by solder 35 that improves the connection of foot 26 of upper IC 12 with upper connective element 44 of carrier structure 40. Upper and lower ICs 12 and 14 are physically connected together with adhesive 34 in this depicted embodiment.

In the embodiment shown in FIG. 5, connective elements 44 and 46 are typically etched pads although other means of connection are known in the art. Solder 35 is also shown providing certain connection between lead 22 of lower IC 14 and lower connective element pad 46 of interposer or carrier structure 40. As shown, termini 25 of leads 22 establish line 5OL by which interposer 40 is allocated into inner section 40I and external section 40EX. In this embodiment depiction, the end of upper and lower connective elements 44 and 46, respectively, are coincident with the termini of leads 22 and traces 60 and 62 are on the upper and lower surfaces 45 and 47 of interposer 40 and extend onto external section 40EX.

Figure 6:
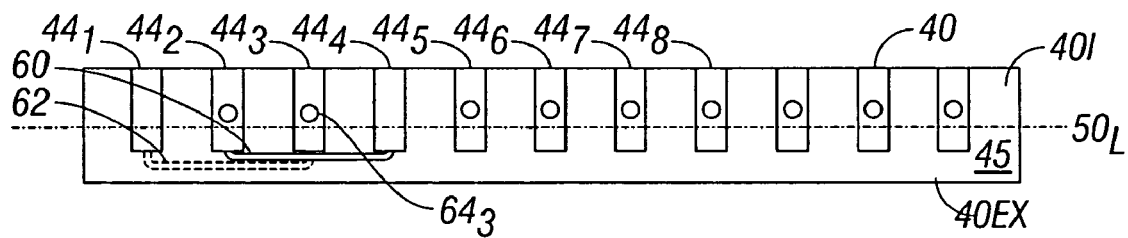
FIG. 6 is a plan view from above of an exemplar interposer or carrier structure illustrating the paths of connective traces along the upper and lower surfaces of the interposer.

FIG. 6 is a plan view from above of an exemplar interposer or carrier structure 40 depicting the paths of connective traces 60 along upper surface 45 of interposer 40 and connective trace 62 (shown in dotted line) along lower surface 47 of interposer 40. As those of skill will recognize, traces 60 and 62 are composed from conductive (typically metal) layers on the upper and lower surfaces respectively of interposer 40.

Figure 7:
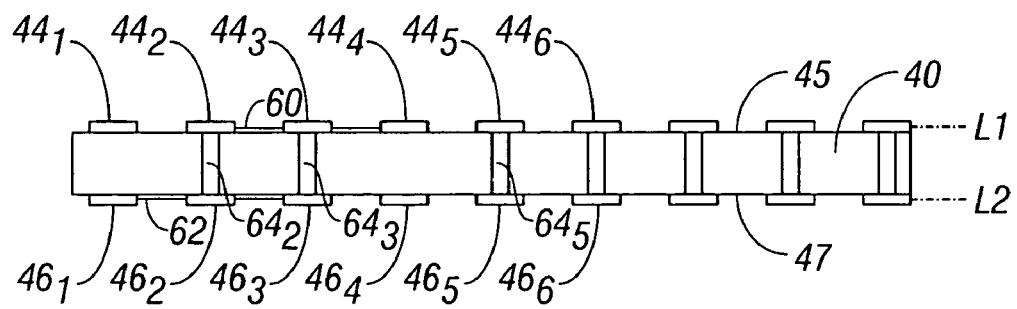
FIG. 7 further illustrates in cross-section, an exemplar interposer or carrier structure in accordance with a preferred embodiment of the present invention.
Figure 8:
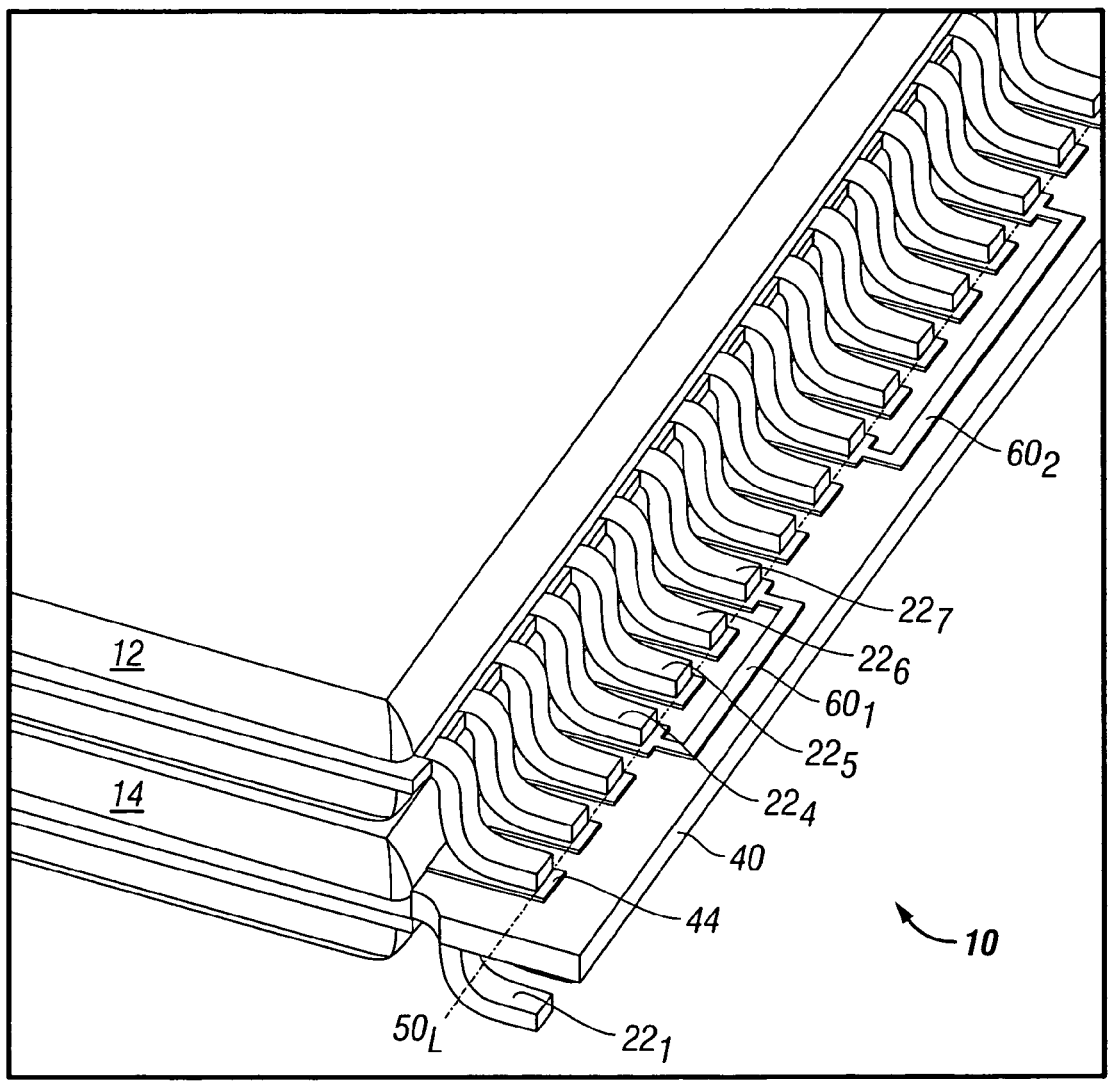
FIG. 8 depicts a portion of a circuit module in accordance with a preferred embodiment of the present invention.
Figure 9:
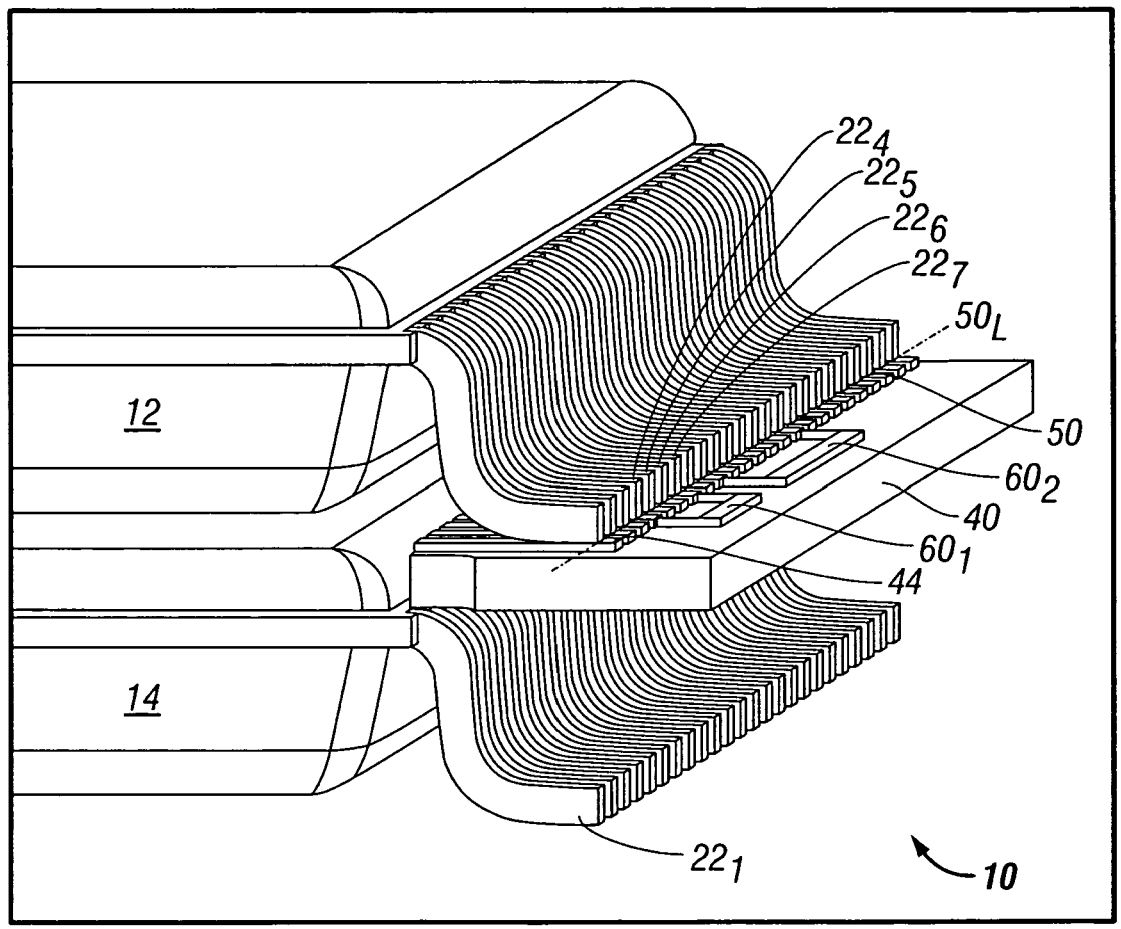
FIG. 9 is another view of a portion of a circuit module in accordance with a preferred embodiment of the present invention.

FIG. 7 further illustrates in cross-section, an exemplar interposer or carrier structure 40 in accordance with a preferred embodiment of the present invention. Thus, with an interposer that can implement connections between non-adjacent leads or connective elements with one or more traces that extend into section 40EX, a simple construction may be adopted for interposer 40 with surface metal layers that express traces such as exemplar traces 60 and 62.

Upper and lower connective elements 44 and 46 are connected to each other in the embodiment shown in FIG. 7 through plated through holes or vias 64 typically drilled in the PCB (where PCB is the support material for interposer 40) during fabrication. The use of vias to connect conductive planes or traces in PCB technology is well known to those of skill in the art. In a preferred embodiment, vias 64 may also be cut through length-wise to create a castellation-like structure. Other connectives besides vias (e.g., traces) may be used to conduct signals between upper and lower connective elements 44 and 46.

Conductive layers L1 and L2 as shown in FIG. 7 on the upper and lower surfaces of interposer 40 are preferably etched to create the appropriate pattern for the upper and lower connective elements 44 and 46, respectively, as well as traces 60 and 62.

Although the present invention has been described in detail, it will be apparent that those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A circuit module comprised of: a first packaged integrated circuit and a second packaged integrated circuit, each of the first and second packaged integrated circuits having an upper surface, a lower surface and a peripheral wall, emergent from first and second sides of said peripheral wall are leads that each have a shoulder and foot, the shoulders each having a head;

a first carrier structure having plural upper and lower connective elements, the upper and lower connective elements being respectively disposed along first and second substantially planar surfaces of the first carrier structure, the upper connective elements being disposed beneath feet of selected leads emergent from the first side of the peripheral wall of the first packaged integrated circuit and the second substantially planar surface of the first carrier structure being disposed along the plane of the heads of selected leads emergent from the first side of the peripheral wall of the second packaged integrated circuit, the first carrier structure having an external section and an internal section which sections are disposed on different sides of a line defined by termini of the feet of leads emergent from the first side of the of the peripheral wall of the first packaged integrated circuit, the external section of the first carrier structure being further from the first packaged integrated circuit than is the internal section, the first carrier structure having a first carrier trace that extends onto the external section of the first carrier structure.

2. The circuit module of claim 1 further comprising:
a second carrier structure having plural upper and lower connective elements, the upper and lower connective elements being disposed along first and second substantially planar surfaces respectively of the second carrier structure, the upper connective elements being disposed beneath feet of selected leads emergent from the second side of the peripheral wall of the first packaged integrated circuit and the second substantially planar surface of the first carrier structure being disposed along the plane of the heads of selected leads emergent from the second side of the peripheral wall of the second packaged integrated circuit, the second carrier structure having an external section and an internal section each of which sections being disposed on different sides of a line defined by termini of the feet of the leads of the first packaged integrated circuit emergent from the second side of the peripheral wall of the first packaged integrated circuit, the external section of the second carrier structure being further from the first packaged integrated circuit than is the internal section, the second carrier structure having a second carrier trace that extends onto the external section of the second carrier structure.

3. The circuit module of claim 1 in which the first carrier trace extends onto the external section of the first carrier structure and along the first or second substantially planar surfaces of the first carrier structure.

4. The circuit module of claim 2 in which the second carrier trace extends onto the external section of the second carrier structure and along the first or second substantially planar surfaces of the second carrier structure.

5. The circuit module of claim 1 in which the first carrier trace connects two non-adjacent ones of the upper or lower connective elements.

6. The circuit module of claim 2 in which the second carrier trace connects two non-adjacent ones of the upper or lower connective elements.

7. The circuit module of claim 5 in which the upper connective elements are pads disposed along the first substantially planar surface of the first carrier structure.

8. The circuit module of claim 6 in which the lower connective elements are pads disposed along the second substantially planar surface of the second carrier structure.

9. The circuit module of claim 3 in which thermally conductive adhesive is disposed between the upper and lower packaged integrated circuits.

10. The circuit module of claim 5 in which the first carrier trace connects two non-adjacent lower connective elements to implement.

11. The circuit module of claim 1 in which a secondary first carrier trace extends onto the external section of the first carrier structure and connects two non-adjacent ones of the upper or lower connective elements.

12. The circuit module of claim 1 in which vias are disposed perpendicularly to the first and second substantially planar surfaces of the first carrier structure.

13. The circuit module of claim 1 in which there are no buried layers in the first carrier structure.

14. The circuit module of claim 2 in which there are no buried layers in the second carrier structure.

15. The circuit module of claim 2 in which the first and second carrier structures are comprised of printed circuit board.

16. The circuit module of claim 2 in which the first and second carrier structures distance the first packaged integrated circuit from the second packaged integrated circuit and between the first and second carrier structures there resides a thermally conductive material.

17. The circuit module of claim 1 in which the first and second packaged integrated circuits are TSOPs.

18. The circuit module of claim 1 in which the first and second packaged integrated circuits are flash memory circuits in TSOP packages.

19. A circuit module having four peripheral sides, the module being comprised of: an upper integrated circuit and a lower integrated circuit, each integrated circuit having an upper surface, a lower surface, and a periphery emergent from which are a plurality of leads each having a shoulder and a foot;
two carrier structures, each disposed on a peripheral side of the module between selected feet of the upper integrated circuit and selected shoulders of the lower integrated circuit to distance the upper integrated circuit above the lower integrated circuit, each of the two carrier structures having an internal section and an external section and there being along one of the two carrier structures, a conductive trace connecting two non-adjacent leads of one of the upper or lower integrated circuits and said conductive trace extending onto and along a surface of the external section of said one of the two carrier structures.

20. The circuit module of claim 19 in which the integrated circuits are TSOP packaged memory circuits.

21. The circuit module of claim 19 in which the integrated circuits are flash memory circuits.

22. The circuit module of claim 19 in which the carrier structures are comprised of printed circuit board material.

23. The circuit module of claim 19 in which thermally conductive material resides in the space between the upper and lower integrated circuits.

24. The circuit module of claim 19 in which the space between the upper and lower integrated circuits is an air gap.

25. The circuit module of claim 19 in which the two carrier structures are etched printed circuit board patterned to connect a no-connect one of the leads of the lower IC with an active lead of the upper IC.

* * * * *

UNITED STATES PATENT AND TRADEMARK OFFICE
CERTIFICATE OF CORRECTION

PATENT NO. : 7,375,418 B2  
APPLICATION NO. : 11/452532  
DATED : May 20, 2008  
INVENTOR(S) : Julian Partridge Page 1 of 1

It is certified that error appears in the above-identified patent and that said Letters Patent is hereby corrected as shown below:

In Claim 1, column 7, line 1, before "peripheral" delete "of the".

Signed and Sealed this

Twelfth Day of August, 2008

JON W. DUDAS  
*Director of the United States Patent and Trademark Office*